US 8,143,662 B2

(12) United States Patent
Endo et al.

(10) Patent No.: US 8,143,662 B2
(45) Date of Patent: Mar. 27, 2012

(54) SEMICONDUCTOR DEVICE

(75) Inventors: Masato Endo, Ashigarakami-gun (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 219 days.

(21) Appl. No.: 11/854,814

(22) Filed: Sep. 13, 2007

(65) Prior Publication Data

US 2008/0067575 A1 Mar. 20, 2008

(30) Foreign Application Priority Data

Sep. 15, 2006 (JP) ................................. 2006-251599

(51) Int. Cl.
*H01L 29/76* (2006.01)
(52) U.S. Cl. ................. 257/314; 257/367; 257/E29.309
(58) Field of Classification Search ............... 257/E29.3, 257/21.422, 316–322, 324, E29.309, 314, 257/315, 368; 438/257–267
See application file for complete search history.

(56) References Cited

U.S. PATENT DOCUMENTS

| 5,726,479 | A | * | 3/1998 | Matsumoto et al. | ........... | 257/412 |
|---|---|---|---|---|---|---|
| 6,074,915 | A | | 6/2000 | Chen et al. | | |
| 6,372,640 | B1 | * | 4/2002 | Chen et al. | ................... | 438/656 |
| 6,383,882 | B1 | | 5/2002 | Lee et al. | | |
| 6,720,612 | B2 | * | 4/2004 | Takeuchi et al. | .............. | 257/315 |
| 7,012,295 | B2 | | 3/2006 | Sato et al. | | |
| 7,045,852 | B2 | * | 5/2006 | Van Duuren et al. | ......... | 257/316 |
| 7,067,872 | B2 | * | 6/2006 | Ichige et al. | .................. | 257/315 |
| 7,078,813 | B2 | | 7/2006 | Sakuma et al. | | |
| 7,122,430 | B2 | | 10/2006 | Sato et al. | | |
| 2004/0043594 | A1 | | 3/2004 | Kammler et al. | | |
| 2004/0262670 | A1 | * | 12/2004 | Takebuchi et al. | ............ | 257/315 |
| 2005/0029573 | A1 | * | 2/2005 | Sato et al. | ...................... | 257/314 |
| 2005/0139904 | A1 | * | 6/2005 | Kamigaichi et al. | ......... | 257/326 |
| 2005/0199938 | A1 | * | 9/2005 | Sakuma et al. | ............... | 257/314 |
| 2005/0218460 | A1 | * | 10/2005 | Hasegawa et al. | ............ | 257/390 |
| 2005/0227440 | A1 | | 10/2005 | Ema et al. | | |
| 2006/0065913 | A1 | * | 3/2006 | Sakuma et al. | ............... | 257/202 |
| 2006/0110874 | A1 | * | 5/2006 | Kim | .............................. | 438/209 |

(Continued)

FOREIGN PATENT DOCUMENTS

CN 1773723 A 5/2006

(Continued)

OTHER PUBLICATIONS

U.S. Appl. No. 12/125,546, filed May 22, 2008, Matsunaga, et al.
U.S. Appl. No. 12/407,131, filed Mar. 19, 2009, Sakuma.
Office Action issued May 13, 2011, in Taiwan Patent Application No. 096134252, filed Sep. 13, 2007 (with English translation).

*Primary Examiner* — Matthew Landau
*Assistant Examiner* — Joseph C Nicely
(74) *Attorney, Agent, or Firm* — Oblon, Spivak, McClelland, Maier & Neustadt, L.L.P.

(57) ABSTRACT

A semiconductor device comprising a first insulating film provided on a semiconductor substrate in a cell transistor region, a first conductive film provided on the first insulating film, an inter-electrode insulating film provided on the first conductive film, a second conductive film provided on the inter-electrode insulating film and having a first metallic silicide film on a top surface thereof, first source/drain regions formed on a surface of the semiconductor substrate, a second insulating film provided on the semiconductor substrate in at least one of a selection gate transistor region and a peripheral transistor region, a third conductive film provided on the second insulating film and having a second metallic silicide film having a thickness smaller than a thickness of the first metallic silicide film on a top surface thereof, and a second source/drain regions formed on the surface of the semiconductor substrate.

18 Claims, 20 Drawing Sheets

U.S. PATENT DOCUMENTS

| | | |
|---|---|---|
| 2006/0157774 A1* | 7/2006 | Chang .......................... 257/315 |
| 2006/0197160 A1* | 9/2006 | Sugimae et al. ............. 257/365 |
| 2006/0197226 A1* | 9/2006 | Matsui et al. ................ 257/758 |
| 2006/0220103 A1* | 10/2006 | Watanobe et al. ........... 257/316 |
| 2006/0237767 A1 | 10/2006 | Sakuma et al. |
| 2007/0018226 A1* | 1/2007 | Kamigaichi et al. ......... 257/313 |
| 2007/0057316 A1 | 3/2007 | Yaegashi |
| 2007/0164343 A1* | 7/2007 | Matsui et al. ................ 257/314 |
| 2010/0044769 A1* | 2/2010 | Kutsukake et al. .......... 257/314 |

FOREIGN PATENT DOCUMENTS

| | | |
|---|---|---|
| JP | 2000-150681 | 5/2000 |
| JP | 2003-234421 | 8/2003 |
| JP | 2005-79575 | 3/2005 |
| TW | 454353 | 9/2001 |
| TW | 200507189 | 2/2005 |

* cited by examiner

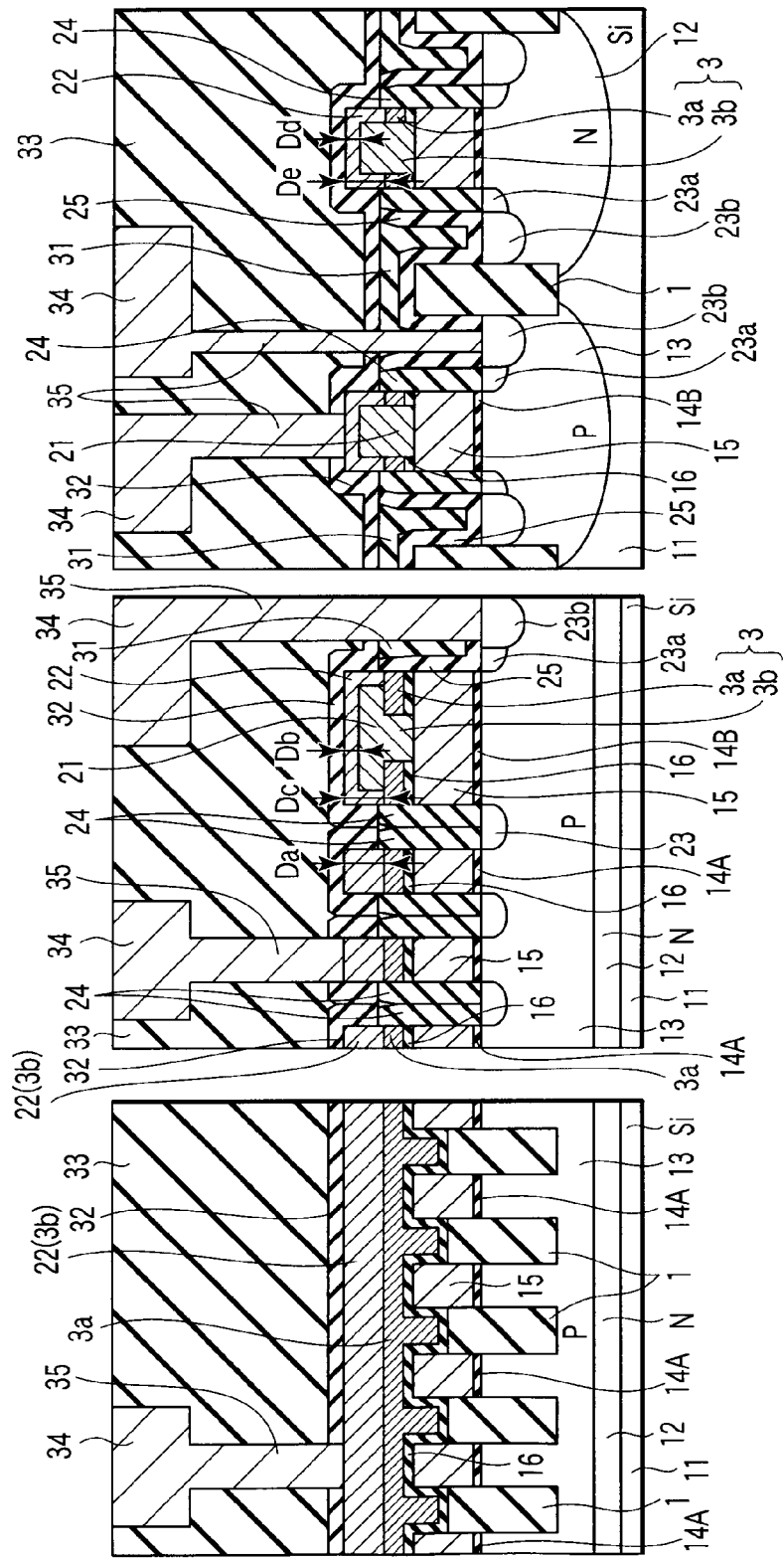

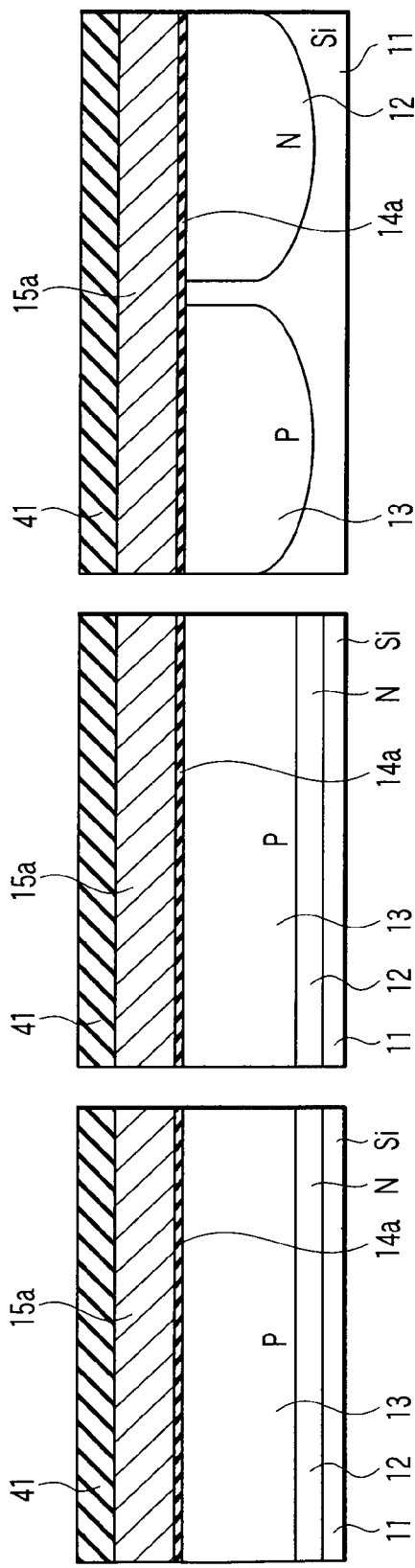

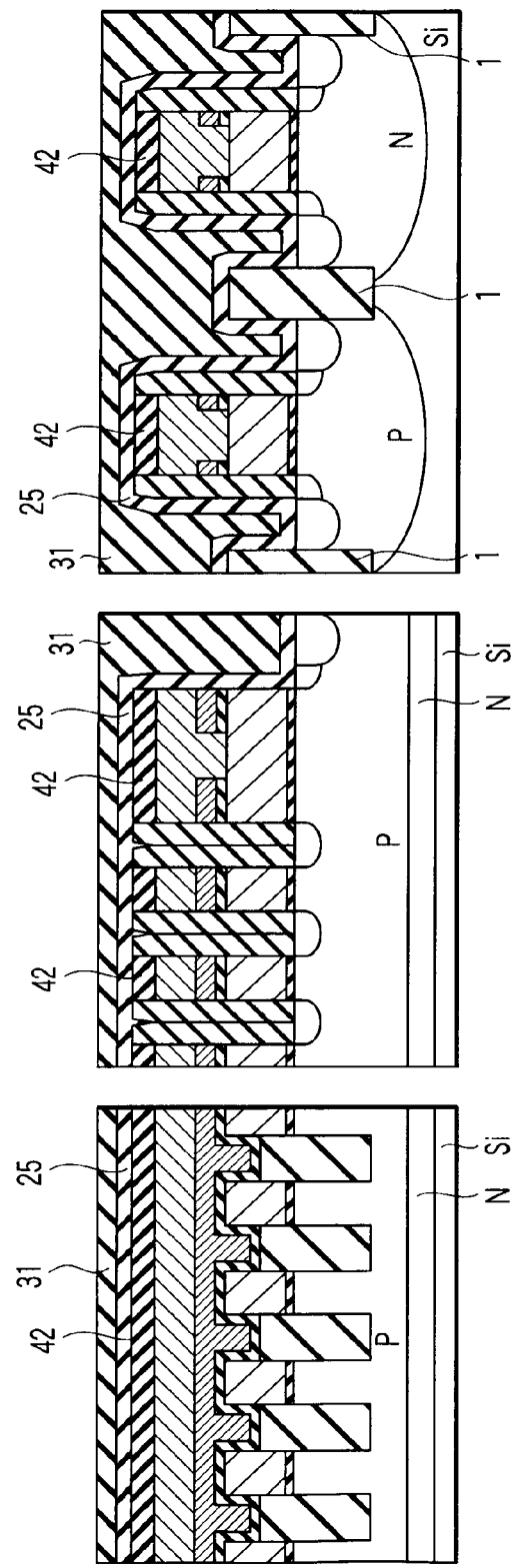

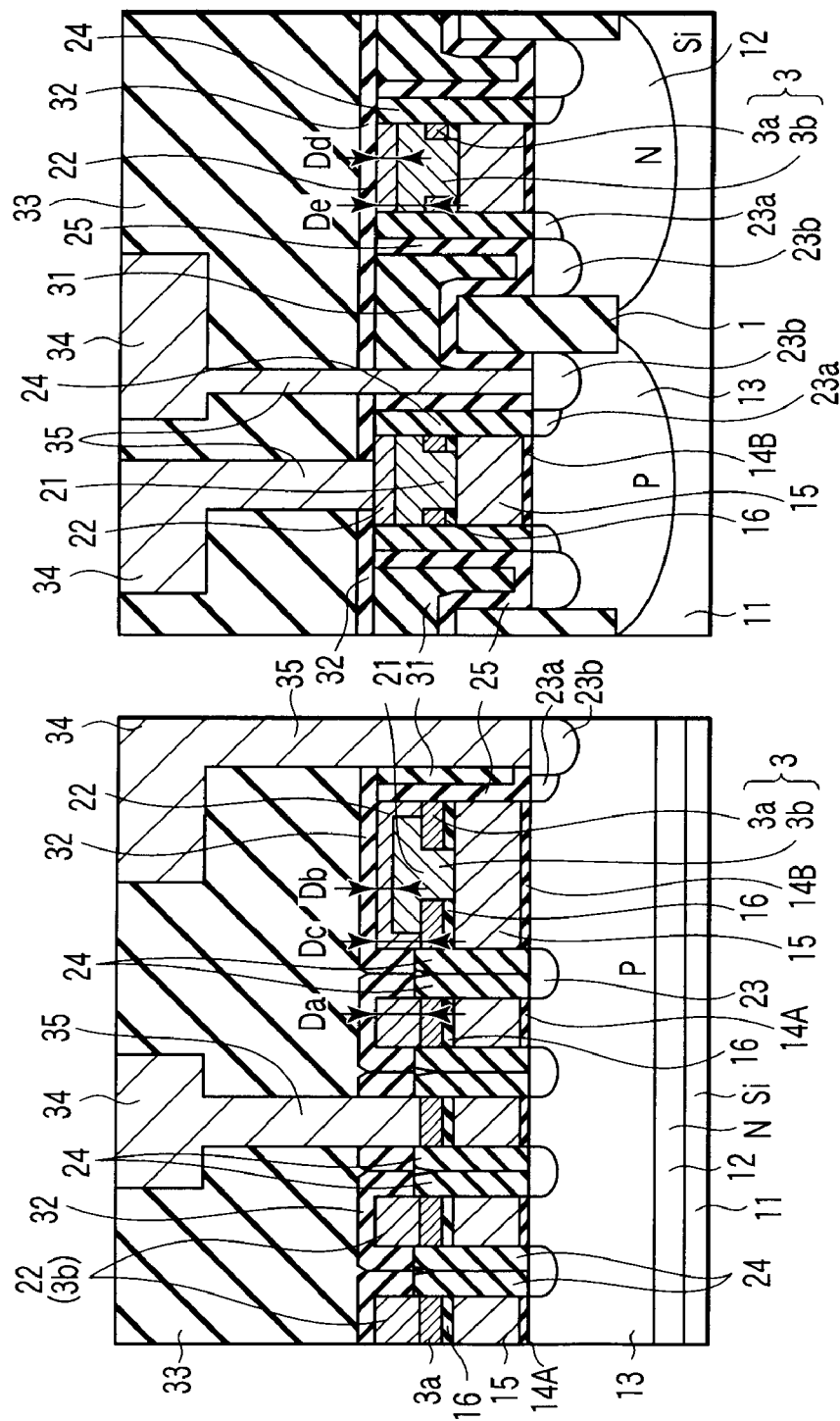

US 8,143,662 B2

SEMICONDUCTOR DEVICE

CROSS-REFERENCE TO RELATED APPLICATIONS

This application is based upon and claims the benefit of priority from prior Japanese Patent Application No. 2006-251599, filed Sep. 15, 2006, the entire contents of which are incorporated herein by reference.

BACKGROUND OF THE INVENTION

1. Field of the Invention

The present invention relates to a semiconductor device and a method of manufacturing the same and, more particularly, to, for example, a stacked transistor having a structure in which a floating gate electrode and a control gate electrode are provided through an inter-electrode insulating film and a method of manufacturing the same.

2. Description of the Related Art

A nonvolatile semiconductor storage device using a transistor having a structure in which a floating gate electrode, an inter-electrode insulating film, and a control gate electrode are stacked is known. By using such a transistor as a memory cell and connecting a plurality of such memory cells in series, a NAND cell string of a so-called NAND flash memory is constituted.

An attempt is made to reduce the resistance value of the control gate electrode by using a metallic silicide film in a part of an electrode film serving as a control gate electrode of the NAND flash memory. Turning an electrode film into a metallic silicide film is performed by depositing a metallic film for constituting a metallic silicide film on a top surface of an electrode film constituted of polysilicon, and heating the polysilicon film and the metallic film. As a result of this, metallic atoms diffuse into the polysilicon film, and react with the polysilicon, thereby forming a metallic silicide film.

Recently, as a result of turning a control gate electrode film into a metallic silicide film, following phenomena have been confirmed. That is, the phenomena are an increase in the resistance value of a control gate electrode, an increase in the variation in the resistance value of a control gate electrode in a memory cell area, progress in deterioration of a control gate electrode caused by an increase in agglomeration, and the like. Incidentally, agglomeration implies a phenomenon in which metallic atoms move because of formation of crystal grains.

These phenomena are assumed to be due to progress in micronization of a semiconductor device. The phenomena will be described below. With the pursuit of micronization of the semiconductor storage device, sizes of parts in the semiconductor storage device continue becoming smaller. With the micronization, a width of a control gate electrode becomes narrower, thereby increasing an aspect ratio (ratio of a height to a width) of the control gate electrode.

An increase in the aspect ratio of the control gate electrode makes it necessary to form a metallic silicide film having a high aspect ratio. As described above, when a metallic silicide film is formed, metallic atoms diffuse into the polysilicon film from a metallic element film provided on the polysilicon film. That is, the metallic atoms diffuse in the film thickness direction of the polysilicon film. Accordingly, the volume of the polysilicon to be turned into the metallic silicide is determined in accordance with the degree of diffusion of the metallic atoms. In order to equalize characteristics among memory cells, it is desirable that the volume of the polysilicon to be turned into the metallic silicide be uniform among the control gate electrodes. That is, it is necessary to appropriately control diffusion of the metallic atoms in the film thickness direction of the control gate electrode. However, in general, the deeper the region of the polysilicon film desired to be turned into the metallic silicide becomes in the depth direction of the polysilicon film, the more difficult control of the diffusion length of the metallic atoms becomes. For this reason, an increase in the aspect ratio of the control gate electrode described above causes the diffusion length of metallic atoms to largely vary among the control gate electrodes. As a result, an increase in the resistance value of a control gate electrode, an increase in the variation in the resistance value of a control gate electrode among cells, progress in deterioration of a control gate electrode caused by an increase in agglomeration, and the like described above occur.

An example is disclosed in U.S. Pat. No. 7,012,295 and U.S. Pat. No. 7,122,430 (Both are based on Jpn. Pat. Appln. KOKAI Publication No. 2005-26589) in which a control gate of a memory cell and a selection transistor and a diffusion layer of the selection transistor are turned into the silicide.

BRIEF SUMMARY OF THE INVENTION

A semiconductor device of an aspect of the present invention comprising a first insulating film provided on a semiconductor substrate in a cell transistor region, a first conductive film provided on the first insulating film, an inter-electrode insulating film provided on the first conductive film, a second conductive film provided on the inter-electrode insulating film and having a first metallic silicide film on a top surface thereof, first source/drain regions formed on a surface of the semiconductor substrate and sandwiching a region under the first insulating film, a second insulating film provided on the semiconductor substrate in at least one of a selection gate transistor region and a peripheral transistor region, a third conductive film provided on the second insulating film and having a second metallic silicide film having a thickness smaller than a thickness of the first metallic silicide film on a top surface thereof, and a second source/drain regions formed on the surface of the semiconductor substrate and sandwiching a region under the second insulating film.

BRIEF DESCRIPTION OF THE SEVERAL VIEWS OF THE DRAWING

FIGS. 2A to 2C show cross-sectional views of a semiconductor storage device according to the first embodiment.

FIGS. 3A to 3C show cross-sectional views each showing a part of manufacturing steps of the semiconductor device shown in FIGS. 2A to 2C.

FIGS. 10A to 10C show cross-sectional views showing steps subsequent to those shown in FIGS. 9A to 9C.

FIGS. 15A and 15B show cross-sectional views of a semiconductor storage device according to a second embodiment.

DETAILED DESCRIPTION OF THE INVENTION

Embodiments of the present invention will be described below with reference to the accompanying drawings. Incidentally, constituent elements having substantially the same functions and configurations are denoted by the same reference symbols and a duplicated description will be given only when necessary.

In this embodiment, description will be given by taking a NAND flash memory as an example. However, the present invention is not limited to this. Needless to say, the present invention can be applied to a NOR flash memory.

First Embodiment

Figure 1:
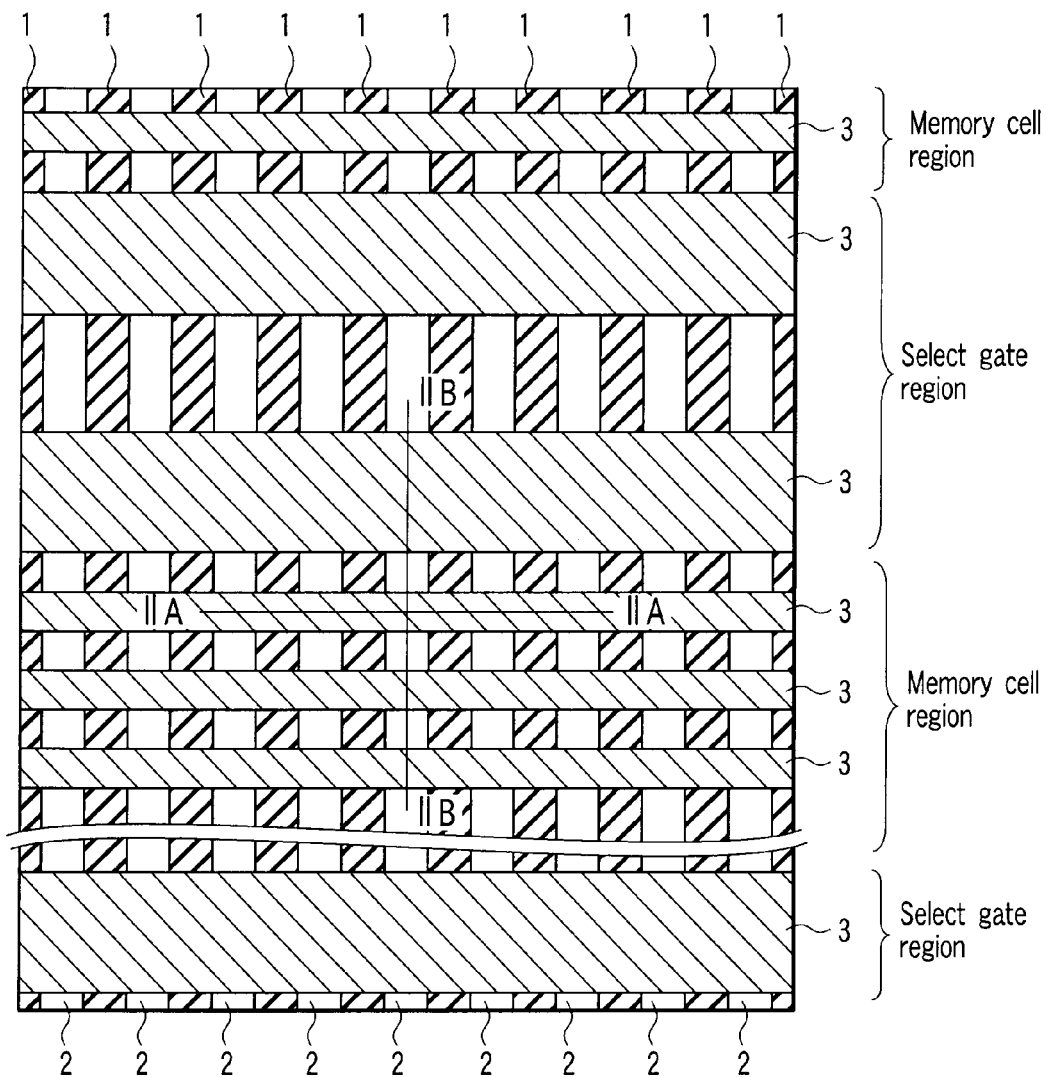
FIG. 1 is a plan view of a semiconductor storage device according to a first embodiment.

A semiconductor device according to a first embodiment of the present invention will be described below with reference to FIGS. 1, 2A, 2B, 2C to 14A, 14B, and 14C. FIG. 1 is a plan view showing a part of the semiconductor device according to the first embodiment of the present invention. FIGS. 2A to 2C are cross-sectional views schematically showing a main part of the semiconductor device according to the first embodiment of the present invention. FIGS. 2A and 2B are cross-sectional views taken along lines IIA-IIA and IIB-IIB, respectively. FIG. 2C is a cross-sectional view of a transistor (peripheral transistor) in a peripheral circuit region.

As shown in FIG. 1, the semiconductor device has selection gate (selection gate transistor) regions and memory cell (memory cell transistor) regions. The memory cell region is interposed between selection gate regions. An element isolation insulating film 1 of a shallow trench isolation (STI) structure is formed on a semiconductor substrate (not shown) constituted of, for example, silicon. The element isolation insulating film 1 is a region formed by a plurality of bands arranged in the vertical direction in the drawing so as to divide an element region (active region) 2 of a semiconductor substrate 11.

A plurality of control gate electrodes 3 extend in the lateral direction of the drawing. Further, the control gate electrodes 3 are arranged at intervals in the vertical direction of the drawing. The control gate electrodes 3 in the memory cell region each constitute a part of a memory cell transistor, and the control gate electrodes 3 in the selection gate region each constitute a part of a selection gate transistor.

Floating gate electrodes are provided below the control gate electrodes 3 and on the surface of the semiconductor substrate in the element region. The floating gate electrodes are arranged at intervals in the lateral direction of the drawing.

As shown in FIGS. 2A to 2C, an n type well 12 and a p type well 13 are formed on the surface of the semiconductor substrate formed of, for example, silicon or the like. Further, the element isolation insulating film 1 is formed on the surface of the semiconductor substrate 11. The element isolation insulating film 1 protrudes from the surface of the semiconductor substrate 11.

Insulating films 14A and 14B constituted of, for example, a silicon dioxide film are provided on the surface of the semiconductor substrate 11 of the element region 2. The insulating film 14A constitutes a part of the memory cell transistor, and functions as a tunnel insulating film. The insulating film 14B constitutes a part of each of the selection gate transistor and the peripheral transistor, and functions as a gate insulating film. Stacked gate electrode structures adjacent to each other so as to be separate from each other are provided on the insulating films 14A and 14B.

Each stacked gate electrode structure has a pattern as shown in FIG. 1 on the plan. As shown in FIGS. 2A, 2B, and 2C, each stacked gate electrode structure includes a floating gate electrode 15, an inter-electrode insulating film 16, a control gate electrode 3, and the like.

In the stacked gate electrode structure, a floating gate electrode 15 is provided on each of the insulating films 14A and 14B. The floating gate electrode 15 is constituted of, for example, conductive polysilicon. The floating gate electrode 15 has a thickness of, for example, 85 nm according to the 55 nm rule.

The inter-electrode insulating film 16 is provided on the floating gate electrode 15. The inter-electrode insulating film 16 is constituted of, for example, a stacked film (ONO film) of a silicon dioxide film, a silicon nitride film, and a silicon dioxide film, or a stacked film (NONON film) of a silicon nitride film, a silicon dioxide film, a silicon nitride film, a silicon dioxide film, and a silicon nitride film, or a dielectric film containing aluminum or hafnium.

The selection gate transistor and the peripheral transistor have a structure in which the inter-electrode insulating film 16 has an opening 21 penetrating the top surface and the undersurface, and the control gate electrode 3 that is the upper layer and the floating gate electrode 15 that is the lower layer are electrically connected to each other.

The control gate electrode 3 is provided on the inter-electrode insulating film 16. The control gate electrode 3 has stacked two conductive layers 3a and 3b. The first part 3a of the first control gate is constituted of, for example, electrically conductive polysilicon, and has a thickness of, for example, 40 nm according to the 55 nm rule. The first part 3a of the control gate electrode 3 of the selection transistor and the peripheral transistor has an opening 21 penetrating the top surface and the undersurface. The opening 21 of the first part 3a of the control gate electrode 3 and the opening 21 of the inter-electrode insulating film 16 coincide with each other in the position on the plan.

The second part 3b of the control gate electrode 3 has a thickness of, for example, 100 nm according to the 55 nm rule. A part of the second part 3b of the control gate electrode 3 fills up the opening 21, and is connected to the floating gate electrode 15. By virtue of this structure, in the selection gate transistor and the peripheral transistor, the floating gate electrode 15 and the control gate electrode 3 integrally constitute a gate electrode of the transistor.

The second part 3b of the control gate electrode 3 is constituted of, for example, conductive polysilicon, and is partly or wholly tuned into the metallic silicide by the transistor. More specifically, in the selection gate transistor and the peripheral transistor, the top surface and the side surface are turned into the metallic silicide, and a metallic silicide film 22 is formed in these regions. In the selection gate transistor and the peripheral transistor, the metallic silicide film 22 has a thickness at the top surface and a width on the side surface of, for example, 15 to 40 nm.

On the other hand, in the memory cell transistor, in a typical example, the second part 3b of the control gate electrode 3 is wholly turned into the metallic silicide, and a metallic silicide film 22 constitutes the second part 3b of the selection gate electrode.

The second part 3b of the control gate electrode 3 of the memory cell transistor is wholly turned into the metallic silicide, and only the top surface and the side surface of the second part 3b of the control gate electrode 3 of the selection gate transistor and the peripheral transistor are turned into the metallic silicide.

In each transistor, the metallic silicide film 22 is formed to have such a feature, and hence each metallic silicide film 22 has the following relationship. First, the thickness Db of a part of the metallic silicide film 22 closer to the center than the region turned into the metallic silicide, of the side surface of the second part 3b of the control gate electrode of the selection gate transistor, is smaller than the thickness Dc of the metallic silicide film 23 of the side surface of the second part 3b. Likewise, the thickness Dd of a part of the metallic silicide film 22 closer to the center than the region turned into the metallic silicide, of the side surface of the second part 3b of the control gate electrode of the peripheral transistor, is smaller than the thickness De of the metallic silicide film 23 of the side surface of the second part 3b. On the other hand, the thickness of the metallic silicide film 22, in a vertical direction (a direction which is parallel to the main surface of the semiconductor substrate 11), on a side surface of the second part 3b is equal to a thickness Db, Dd.

Further, the thickness Db, Dd is smaller than the thickness Da of the metallic silicide film 22 of the second part 3b of the control gate electrode 3 of the cell transistor. The second part 3b of the cell transistor is typically turned into the silicide as a whole, and the thickness Da is therefore the same at any part of the second part 3b of the cell transistor.

Incidentally, in the drawing, although the entire part of the second part 3b of the memory cell transistor is turned into the silicide, the present invention is not limited to this. That is, at least a region of the second part 3b above a predetermined position should only be turned into the silicide as a whole. Specifically, for example, the upper half part of the second part 3b is wholly turned into the silicide. In this case, the thickness of the second part 3b is determined by a resistance value required of the second part 3b. That is, the smaller the required resistance value is, the thicker the silicide film 22 on the top surface of the second part 3b becomes.

The thickness of the second part 3b of the memory cell transistor is, at the maximum, the entirety of the control gate electrode 3, i.e., the entirety of the first part 3a and the second part 3b. Actually, in order to securely prevent the first part 3a of the control gate electrode 3 and the floating gate electrode 15 from causing a short circuit, the region above the undersurface of the second part 3b is turned into the silicide. The method of controlling the thickness of the silicide film 22 will be described later in the description of the manufacturing method.

Source/drain diffusion regions 23 of a conduction type corresponding to the conduction type of each transistor are formed so as to sandwich the channel region under each stacked gate electrode structure of the cell transistor, selection transistor, and peripheral transistor. The source/drain diffusion region 23 has, at a part on the opposite side of the memory cell transistor of the selection gate transistor, and at the peripheral transistor, a part 23a for reducing the resistance between itself and the contact plug, in contact with the channel region, and a part 23b having a higher concentration than the part 23a.

A sidewall insulating film 24 constituted of, for example, a silicon dioxide film or a silicon nitride film is provided on the side surface of each stacked gate electrode structure. The sidewall insulating film 24 is formed so as to allow it to reach an intermediate height of the stacked gate electrode structure, and the height thereof will be described later in detail.

The sidewall insulating film 24 is not provided at the end on the opposite side of the memory cell transistor of the selection gate transistor. This is because to make the distance between respective selection gate transistors large. However, this configuration is not indispensable, and the sidewall insulating film 24 may be provided.

On the side surface on the opposite side of the memory cell transistor of the selection gate transistor, and on the side surface of the sidewall insulating film of the peripheral transistor, a barrier film 25 constituted of, for example, a silicon dioxide film or a silicon nitride film or the like is provided. The barrier film 25 has a function of an etching stopper. In the peripheral transistor region, the barrier film 25 is also provided on the source/drain diffusion region 23, and the element isolation insulating film 1.

The region up to the same height as the sidewall insulating film 24 between the respective transistors is filled up with an inter-layer insulating film 31. The inter-layer insulating film 31 is constituted of, for example, a silicon oxide film.

On the sidewall insulating film 24, a covering insulating film 32 is provided on the side surface which is not covered with the sidewall insulating film 24 of the stacked gate electrode structure, and on the top surface of the control gate electrode 3. The covering insulating film 32 also covers the top surface of the inter-layer insulating film 31. The covering insulating film 32 is constituted of, for example, a silicon dioxide film or a silicon nitride film, and has a thickness of, for example, 30 nm.

An inter-layer insulating film 33 constituted of, for example, a silicon dioxide film is provided on the entire surface of the covering insulating film 32. A wiring layer 34 is provided in the inter-layer insulating film 33. A plug 35 extending from the wiring layer 34, penetrating the covering insulating film 32, and reaching the metallic silicide film 22 is provided at the lower part of the wiring layer 34. Further, a plug 35 penetrating the covering insulating film 32, inter-layer insulating film 31, and barrier film 25, and reaching the source/drain diffusion region 23 is provided in a predetermined position at the lower part of the wiring layer 34.

Next, a method of manufacturing a semiconductor device shown in each of FIGS. 2A, 2B, and 2C will be described below with reference to FIGS. 3A, 3B, and 3C to 14A, 14B, and 14C.

FIGS. 3A to 14A show a manufacturing method of the structure shown in FIG. 2A in the order of sequence.

FIGS. 3B to 14B show a manufacturing method of the structure shown in FIG. 2B in the order of sequence.

FIGS. 3C to 14C show a manufacturing method of the structure shown in FIG. 2C in the order of sequence.

First, as shown in FIGS. 3A, 3B, and 3C, wells 12 and 13 are formed by using a lithography step and ion implantation. Then, an insulating film 14a which will become the insulating film 14A or 14B is formed on the entire surface of the semiconductor substrate 11 by, for example, thermal oxidation. Then, a conductive film 15a which will become the floating gate electrode 15 is formed on the insulating film 14a by, for example, chemical vapor deposition (CVD). Then, a mask material 41 constituted of, for example, SiN is formed on the conductive film 15a by, for example, CVD.

Figure 4C:
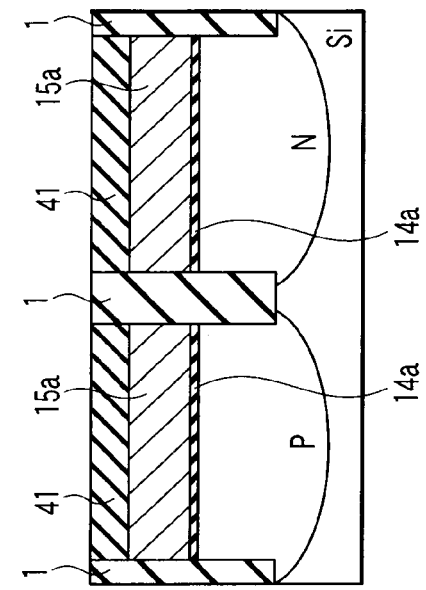
FIGS. 4A to 4C show cross-sectional views showing steps subsequent to those shown in FIGS. 3A to 3C.
Figure 4B:
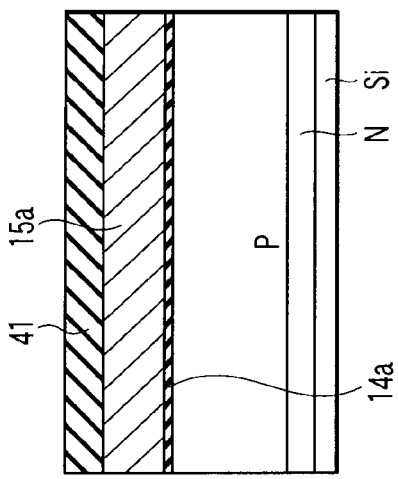
Figure 4A:
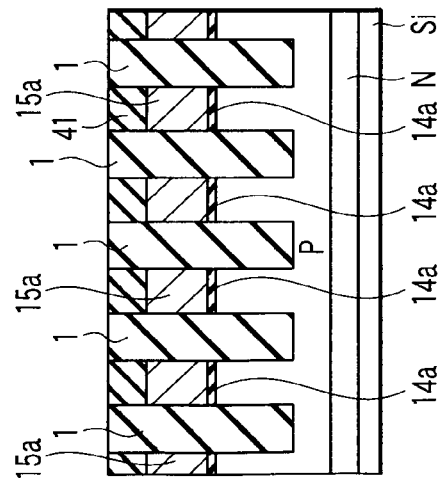

Then, as shown in FIGS. 4A, 4B, and 4C, trenches are formed in a region in which the element isolation insulating film 1 is scheduled to be formed by using a lithography step and the etching technique. The trenches penetrate the mask material 41, conductive film 15a, insulating film 14a, and reach the surface of the semiconductor substrate 11. Then, the trenches are filled up with a film serving as a material for the element isolation insulating film 1. Then, the unnecessary film on the mask material 41 is removed by, for example, chemical mechanical polishing (CMP), thereby forming the element isolation insulating film 1.

Figures 5A, 5B, 5C:
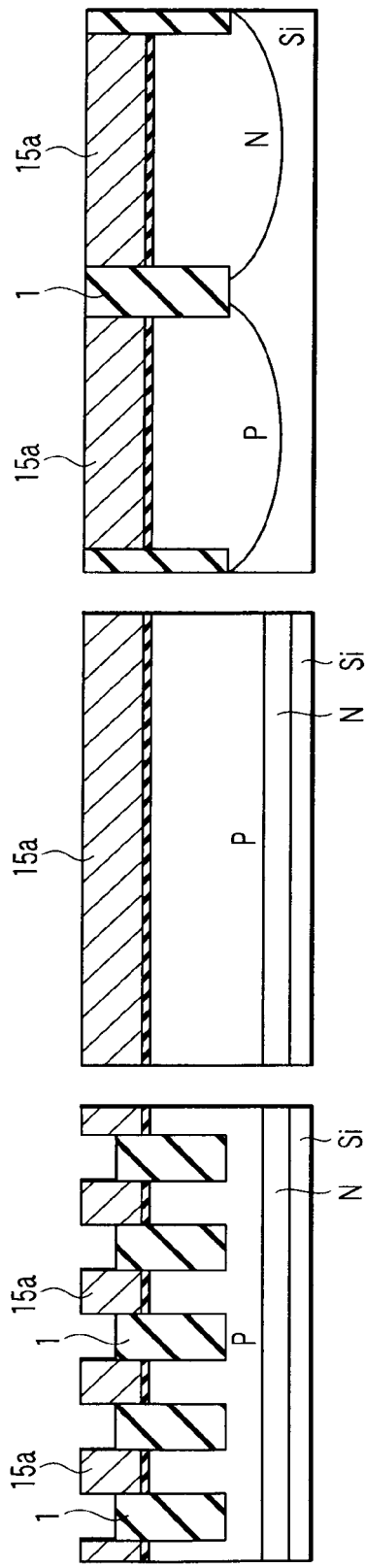
FIGS. 5A to 5C show cross-sectional views showing steps subsequent to those shown in FIGS. 4A to 4C.

Then, as shown in FIGS. 5A, 5B, and 5C, the mask material 41 is removed by, for example, wet etching. Then, in the cell transistor, the top surface of the element isolation insulating film 1 is etched back to a position lower than, for example, the top surface of the electrode film 15a by, for example, reactive ion etching (RIE), wet etching, and the like. As a result of this, in the peripheral transistor region, for example, the element isolation insulating film 1 is caused to retreat to the same height as the conductive film 15a.

Figure 6C:
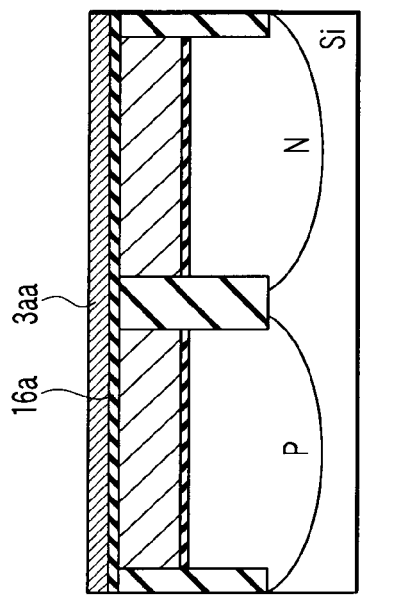
FIGS. 6A to 6C show cross-sectional views showing steps subsequent to those shown in FIGS. 5A to 5C.
Figure 6B:
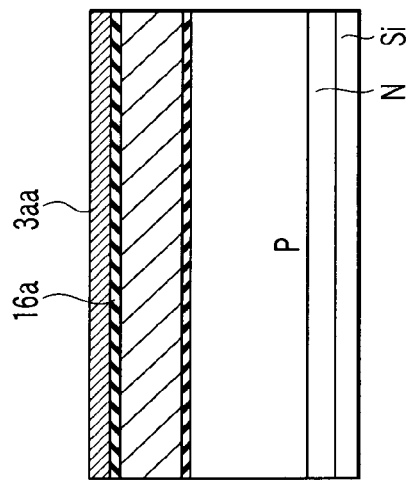
Figure 6A:
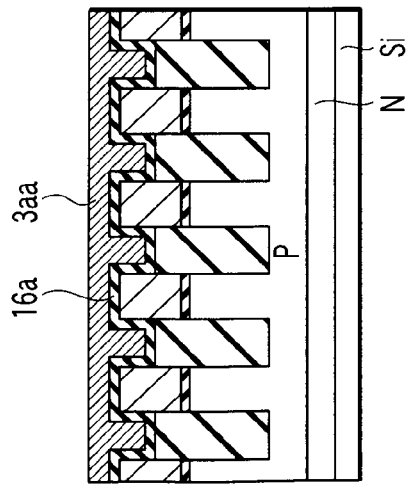

Then, as shown in FIGS. 6A, 6B, and 6C, an insulating film 16a which will become the inter-electrode insulating film 16 is formed on the entire surface of the structure obtained by the steps performed up to now. As a result of this, in the cell transistor region, the exposed side surfaces and top surfaces of the conductive film 15a are covered with the insulating film 16a.

Then, a conductive film 3aa which will become the first part 3a of the control gate electrode is formed on the entire surface of the insulating film 16a by, for example, the CVD method. The conductive film 3aa is constituted of, for example, conductive polysilicon, fills up the regions above the element isolation insulating films 1 formed between the conductive films 15a, and is arranged on the insulating film 16a formed on the top surfaces of the conductive films 15a.

Figure 7C:
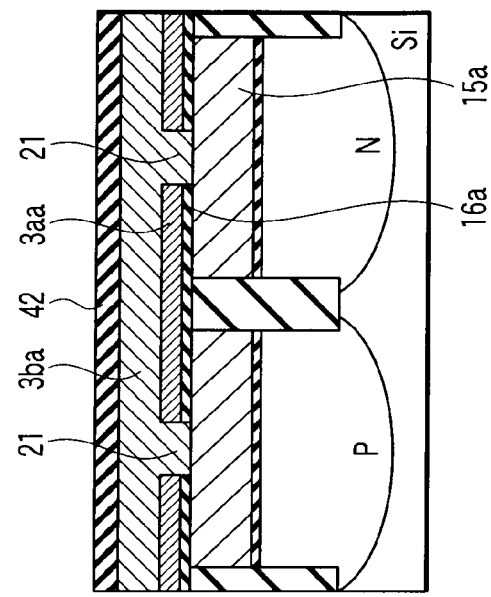
FIGS. 7A to 7C show cross-sectional views showing steps subsequent to those shown in FIGS. 6A to 6C.
Figure 7B:
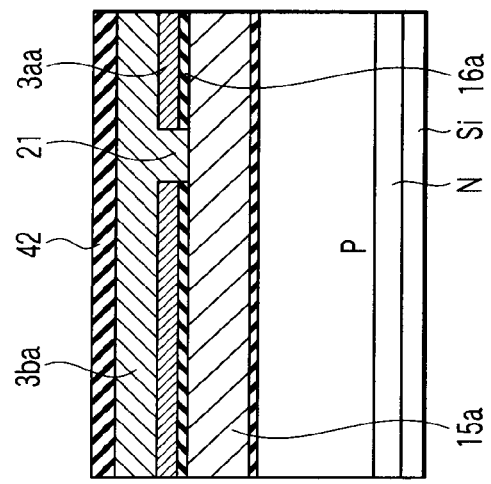
Figure 7A:
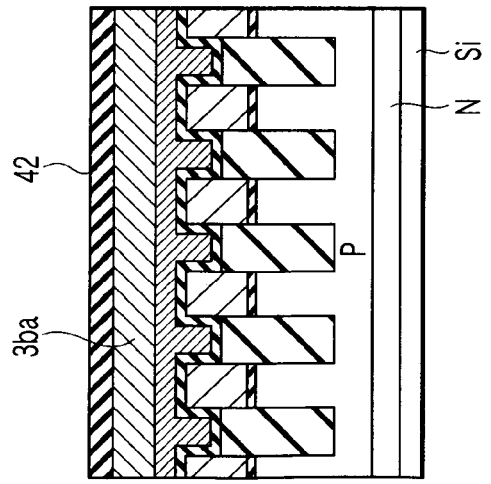

Then, as shown in FIGS. 7A, 7B, and 7C, an opening 21 or openings 21 reaching the conductive film 15a is or are formed in at least part of the conductive film 3aa and insulating film 16a in the region in which the selection gate transistor or the peripheral transistor is scheduled to be formed, by the lithography step and etching technique.

Then, a material film 3ba which will become the second part 3b of the control gate electrode 3 is formed on the entire surface of the structure obtained by the steps performed up to now by, for example, CVD. The material film 3ba is constituted of, for example, conductive polysilicon. As a result of formation of the material film 3ba, a part of the material film 3ba fills the opening 21, and is connected to the conductive film 15a.

Then, a mask material 42 is formed on the entire surface of the material film 3ba by, for example, CVD.

Figures 8A, 8B, 8C:
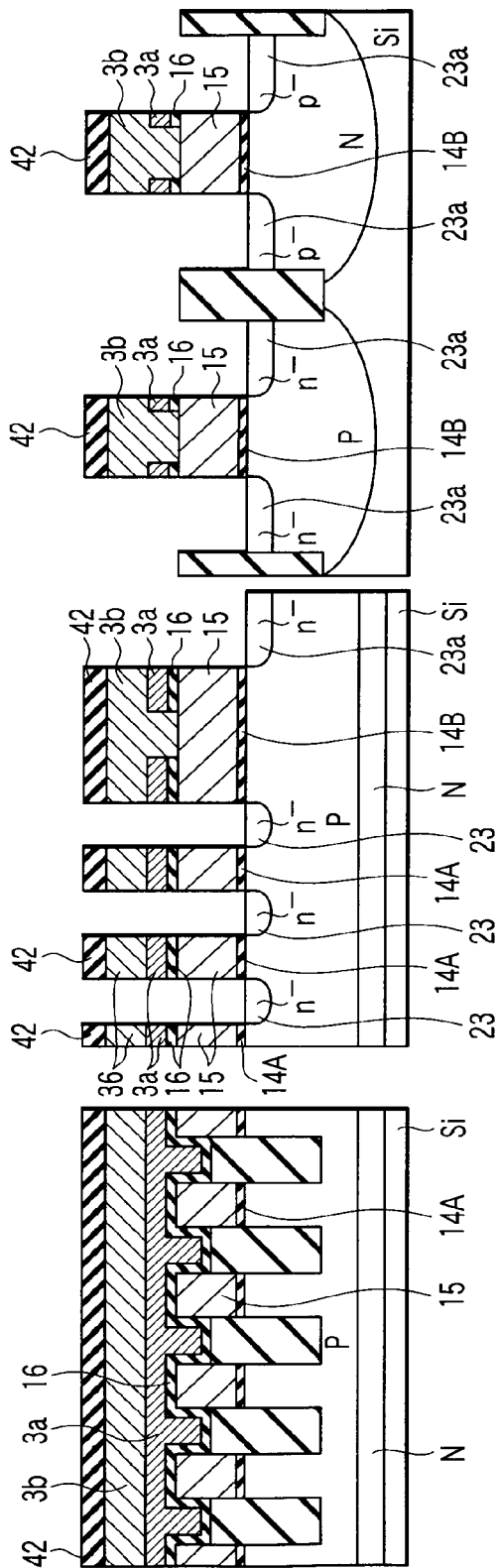
FIGS. 8A to 8C show cross-sectional views showing steps subsequent to those shown in FIGS. 7A to 7C.

Then, as shown in FIGS. 8A, 8B, and 8C, patterning is performed by the lithography step and etching technique in such a manner that the mask material 42 remains in regions in which the stacked gate electrode structure of the cell transistor, selection gate transistor, and peripheral transistor are scheduled to be formed. Then, the material film 3ba, conductive film 3aa, insulating film 16a, conductive film 15a, and insulating film 14a are etched by using the mask material 42. As a result of this, a stacked gate electrode structure of each transistor constituted of the second part 3b of the control gate electrode 3, first part 3a, inter-electrode insulating film 16, and floating gate electrode 15, is formed. Further, the tunnel insulating film 14A and the gate insulating film 14B are formed.

Then, with respect to the structure obtained by the steps performed up to now, in the cell transistor, the source/drain diffusion region 23 is formed, and in each of the selection gate transistor and peripheral transistor, the low concentration part 23a of the source/drain diffusion region 23 is formed, by ion implantation using the stacked gate electrode structure as a mask. Further, in this ion implantation step, ions are implanted in the second part 3b of the control gate electrode, thereby turning the second part 3b into a conductive film. A damage of the ion-implantation which is targeted to the semiconductor substrate is reduced by leaving the insulating film 14a in an etching of a manufacturing process of the stacked gate electrode structure.

In the step of implanting n type impurities, the p type source/drain diffusion region and the region in which the control gate electrode is to be formed are covered with a mask material (not shown). Likewise, in the step of implanting p type impurities, the n type source/drain diffusion region and the region in which the control gate electrode is to be formed are covered with a mask (not shown). The order of implanting n type and p type impurities can be arbitrarily selected.

Figure 9C:
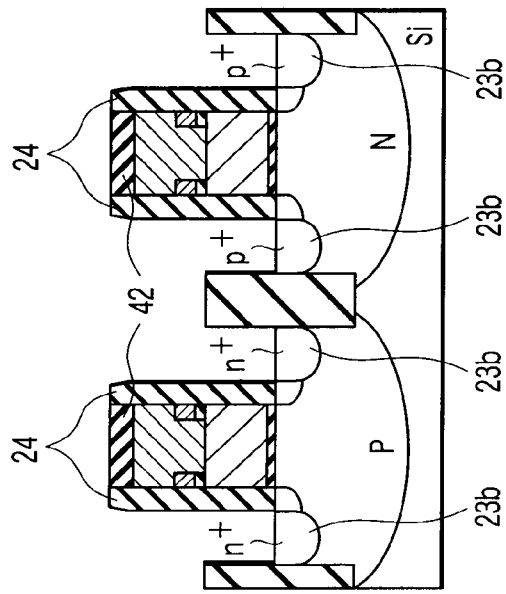
FIGS. 9A to 9C show cross-sectional views showing steps subsequent to those shown in FIGS. 8A to 8C.
Figure 9B:
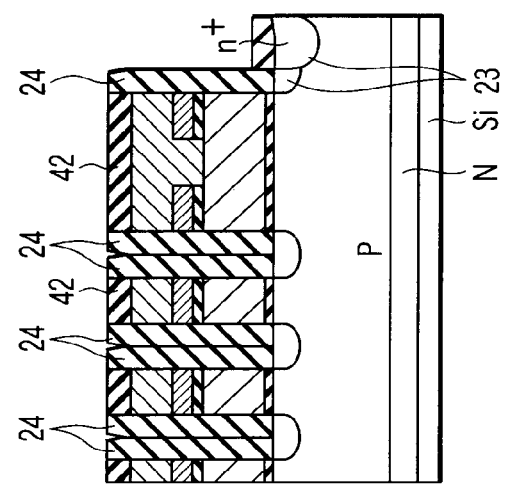
Figure 9A:
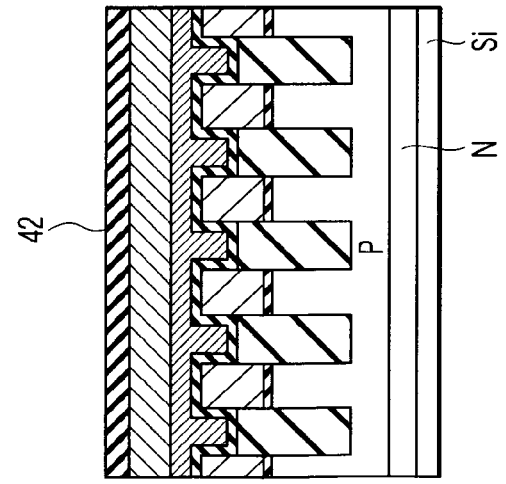

Subsequently, as shown in FIGS. 9A, 9B, and 9C, an insulating film which will become the sidewall insulating film 24 is formed on the entire surface of the structure obtained by the steps performed up to now by, for example, CVD. The side wall insulating film 24 is also formed on the insulating film 14A, when the insulating film 14A is leaved in the etching process.

The thickness of this insulating film is, for example, 20 to 60 nm. Then, of parts of the insulating film, a part on the mask material 42 and a part on the surface of the semiconductor substrate 11 are removed by the etching technique, thereby forming the sidewall insulating film 24. The sidewall insulating film 24 is constituted of a material which can obtain a etching selectivity ratio with respect to the floating gate electrode 15, first part 3a and second part 3b of the control gate electrode 3, i.e., for example, a silicon dioxide film or silicon nitride film, as described above.

Then, the high concentration part 23b of the source/drain diffusion region 23 is formed by ion implantation using the mask material 42 and the sidewall insulating film 24 as a mask. At the time of this step, as in the case shown in FIGS. 8A, 8B, and 8C, regions not to be subjected to implantation are covered with a mask material (not shown) in accordance with the conduction type of impurities to be implanted.

Then, as shown in FIGS. 10A, 10B, and 10C, a mask material (not shown) having an opening above the sidewall insulating film 24 disposed on the opposite side of the memory cell transistor of the selection gate transistor is formed by the lithography step. Then, the sidewall insulating film 24 on the opposite side of the memory cell transistor of the selection gate transistor is removed by the etching using this mask material. Then, the mask material is removed.

Then, a barrier film 25 is formed on the entire surface of the structure obtained by the steps performed up to now by, for example, CVD. As a result of this, a part on the sidewall on the opposite side of the memory cell transistor of the stacked gate electrode structure of the selection gate transistor, a part on the mask material 42, the surface of the semiconductor substrate 11, a part on the sidewall insulating film 24 of the peripheral transistor, and the element isolation insulating film 1 of the peripheral transistor region are covered with the barrier film 25.

Then, an inter-layer insulating film 31 is formed on the entire surface of the structure obtained by the steps performed up to now by, for example, CVD.

Figures 11A, 11B, 11C:
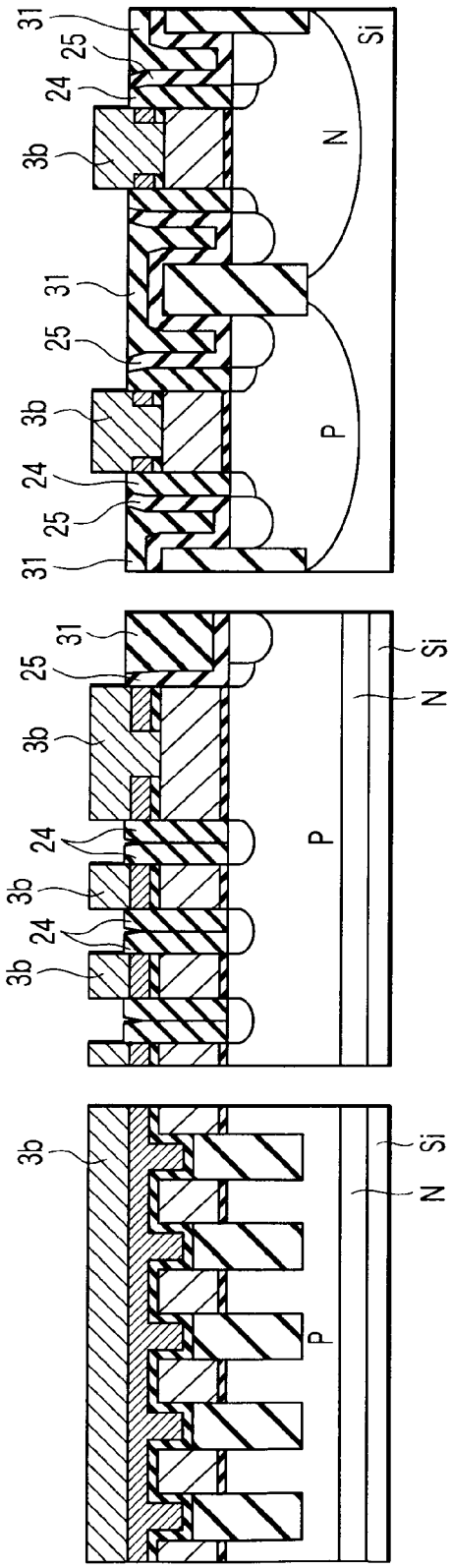
FIGS. 11A to 11C show cross-sectional views showing steps subsequent to those shown in FIGS. 10A to 10c.

Then, as shown in FIGS. 11A, 11B, and 11C, the top surface of the inter-layer insulating film 31 is caused to retreat until the mask material 42 becomes exposed and, at the same time, the mask material 42 on the top surface of the second part 3b of the control gate electrode 3 is removed by, for example, CMP.

Further, the top surface of the sidewall insulating film 24 is caused to retreat to at least a position slightly above the boundary between the first part 3a and the second part 3b of the control gate electrode 3 by using the etching technique. As a result of this, the entire top surface and almost the entire side surface of the second part 3b of the control gate electrode 3 of the cell transistor are exposed.

Depending on the amount of retreat of the sidewall insulating film 24, it becomes possible to control the thickness of the metallic silicide film 22 of the second part 3b of the control gate electrode 3 of the cell transistor.

By the step of causing the top surface of the sidewall insulating film 24, the top surface of the barrier film 25 and the top surface of the inter-layer insulating film 31 also retreat. The retreated top surfaces of the barrier film 25 and the inter-layer insulating film 31 are positioned at the same level as the retreated top surface of the sidewall insulating film 24 when the sidewall insulating film 24, barrier film 25, and the inter-layer insulating film 31 are made of the same material, and the etching selectivity ratio is substantially zero. As a result of this, the entire top surface and almost the entire side surface of the second part 3b of the control gate electrode 3 of the selection gate transistor are exposed. In the peripheral transistor too, the entire top surface and about half the side surface of the second part 3b of the control gate electrode are exposed.

Figure 12A:
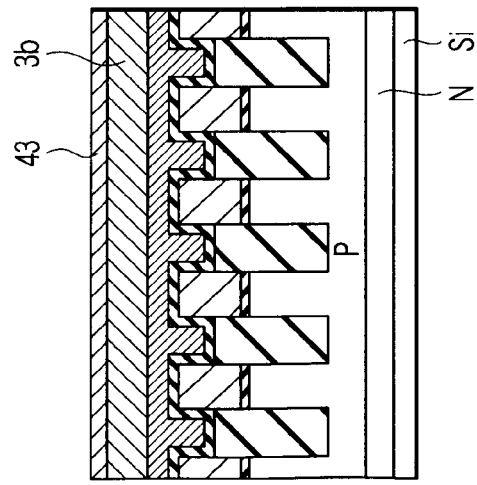
FIGS. 12A to 12C show cross-sectional views showing steps subsequent to those shown in FIGS. 11A to 11C.
Figure 12B:
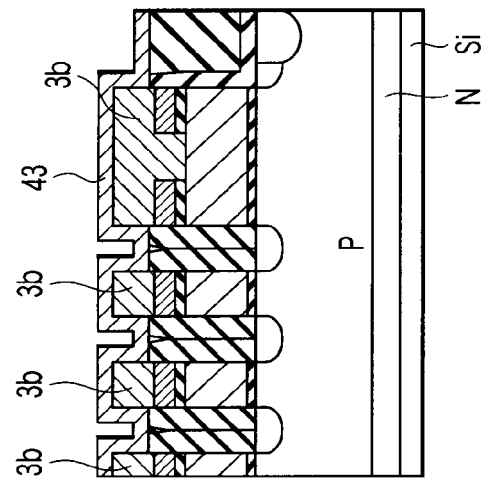
Figure 12C:
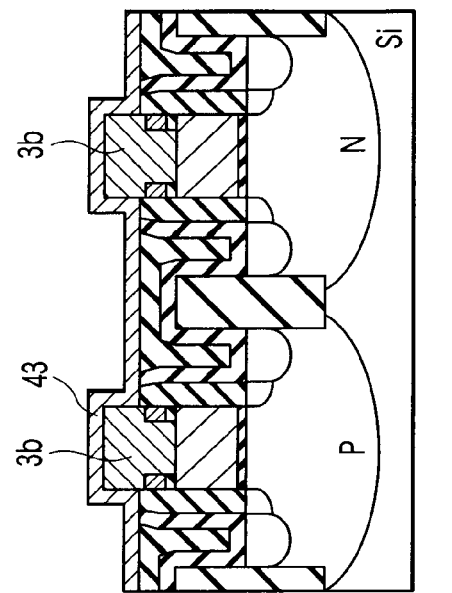

Then, as shown in FIGS. 12A, 12B, and 12C, a metallic film 43 for silicidization is formed on the entire surface of the structure obtained by the steps performed up to now by, for example, CVD or sputtering. As a result of this, the metallic film 43 covers the top surface and exposed side surface of the second part 3b of the control gate electrode 3 of each transistor. The material of the metallic film 43 is, for example, cobalt, titanium, nickel, and the like in accordance with the material of the metallic silicide film 22.

The thickness of the metallic film 43 is determined in such a manner that, of the part of the second part 3b of the control gate electrode 3 of the cell transistor, the entire part corresponding to the same thickness as the thickness of the exposed side surface is silicidized, which will be explained below. In the heat step, metallic atoms in the metallic film 43 diffuse into the second part 3b of the control gate electrode 3, and turns to the metallic silicide film 23. In this embodiment, metallic atoms advance also from the side surface of the second part 3b of the control gate electrode, and hence a wide range of the second part 3b of the control gate electrode 3 can be silicidized without requiring the metallic atoms to diffuse over a long distance unlike in the case where the metallic atoms advance only from the top surface.

Thus, the thickness of the metallic film 43 is determined in such a manner that a distal end of a silicide reaction advancing from the side surface of the second part 3b reaches a distal end of a silicide reaction advancing from the other side surface opposite to the above side surface, whereby of the part of the second part 3b of the control gate electrode 3 of the cell transistor, the entire part corresponding to the same thickness as the thickness of the exposed side surface becomes the metallic silicide film 25.

On the other hand, the diffusion of the metallic atoms changes also depending on the time of the heat step. The heat step may possibly affect adversely the other part which is already formed at the time of the heat step. Hence, in consideration of the above circumstances, it is not desirable to perform the heat step for an excessively long period of time. For this reason, the thickness of the metallic film 43 is determined in such a manner that the metallic silicide film 22 of the above-mentioned range can be formed even by a heat step of such a degree that the other part is not adversely affected.

More specifically, the thickness of the metallic film 43 can be set, for example, in a range of 20 to 60% of the width of the second part 3b of the control gate electrode 3, or in a range of 12 to 20 nm according to the 55 nm rule.

Figure 13C:
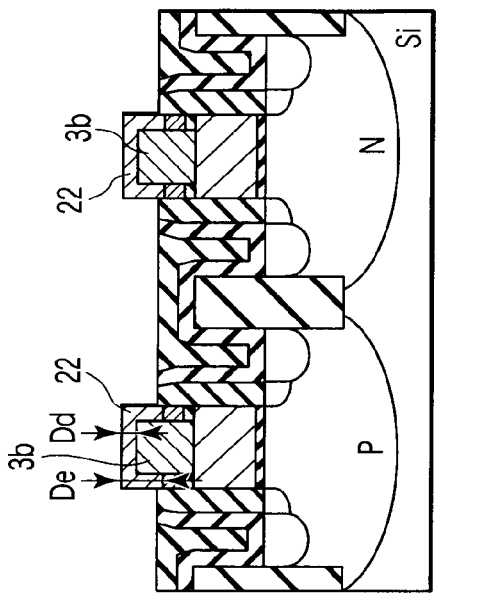
FIGS. 13A to 13C show cross-sectional views showing steps subsequent to those shown in FIGS. 12A to 12C.
Figure 13B:
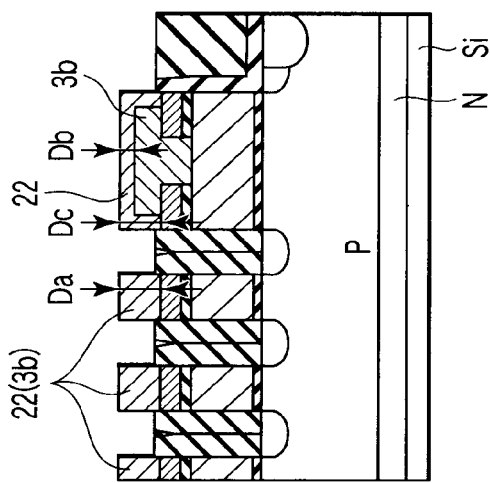
Figure 13A:
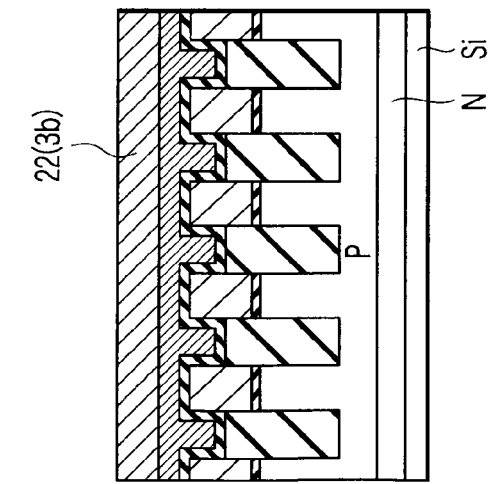

Then, as shown in FIGS. 13A, 13B, and 13C, the metallic silicide film 22 is formed by reacting the metallic film with the second part 3b of the control gate electrode 3 by a heat treatment. The metallic film 43 has the thickness described above, and the metallic atoms diffuse from the top surface and side surfaces of the second part 3b of the control gate electrode 3. Accordingly, by appropriately adjusting the heat treatment time, the distal end of the silicidization advancing from the side surface of the second part 3b reaches the distal end of the silicidization advancing from the side surface on the opposite side of this side surface. As a result of this, of the part of the second part 3b of the control gate electrode 3 of the cell transistor, the part having substantially the same thickness as the second part 3b is wholly turned into the metallic silicide.

On the other hand, the widths of the selection gate transistor and the peripheral transistor in the channel length direction are larger than that of the cell transistor. Accordingly, the silicidization advancing from the side surface of the second part 3b of the control gate electrode 3 of each of the selection gate transistor and the peripheral transistor does not reach the silicidized region extending from the side surface on the opposite side of the above side surface. In other words, of parts of the control gate electrode 3 of each of the selection gate transistor and the peripheral transistor, the part to be silicidized is only the surface of the second part 3b including the top surface and side surface of the control gate electrode 3, and the part further inside the above part is not silicidized. As described above, the thickness Db is smaller than the thickness Dc, the thickness Dd is smaller than the thickness De, and the thickness Db and thickness Dd are smaller than the thickness Da. On the other hand, the thickness of the metallic silicide film 22, in a vertical direction (a direction which is parallel to the main surface of the semiconductor substrate 11), on a side surface of the second part 3b is equal to a thickness Db, Dd.

Subsequently, of parts of the metallic film 43, the part that does not contribute to metal-silicidization, i.e., the part which is not in contact with the second part 3b of the control gate electrode 3 is removed by using the etching technique.

Figures 14A, 14B, 14C:
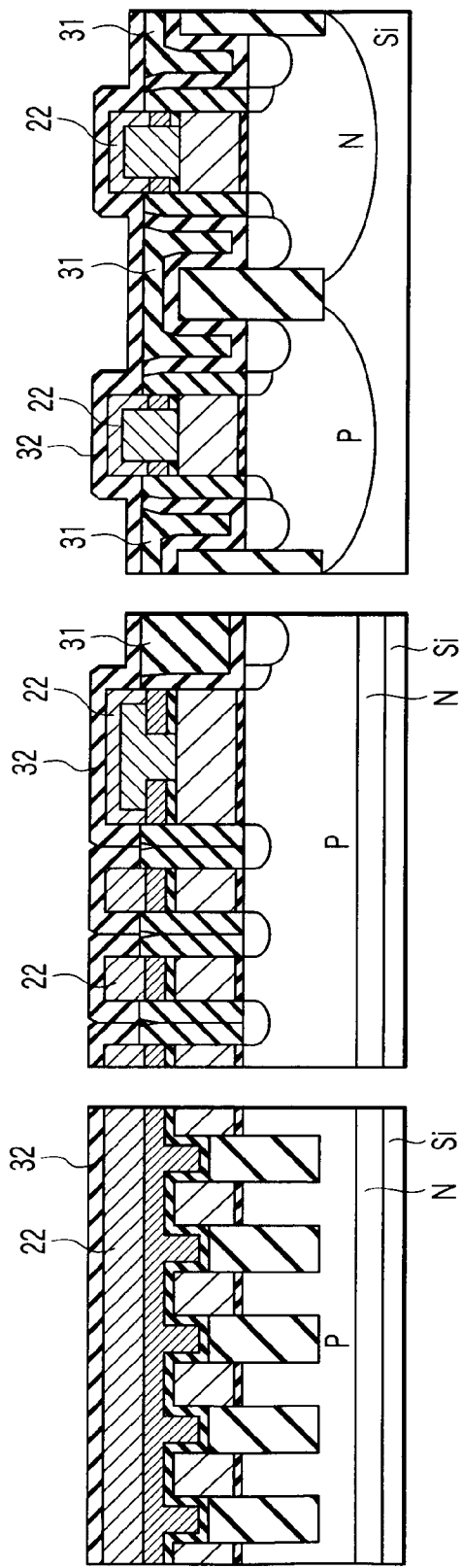
FIGS. 14A to 14C show cross-sectional views showing steps subsequent to those shown in FIGS. 13A to 13C.

Then, as shown in FIGS. 14A, 14B, and 14C, the covering insulating film 32 is formed on the entire surface of the structure obtained by the steps performed up to now by, for example, CVD. The covering insulating film 32 covers the metallic silicide film 22 and also covers the top surface of the inter-layer insulating film 31.

Then, as shown in FIGS. 2A, 2B, and 2C, the inter-layer insulating film 33 is formed on the entire surface of the covering insulating film 32 by, for example, CVD. Then, a wiring trench and contact hole are formed by using the lithography step and etching technique, and a conductive film is formed in the wiring trench and contact hole by CVD and sputtering. As a result of this, the wiring layer 34 and the plug 35 are formed.

Figures 19A, 19B, 19C:
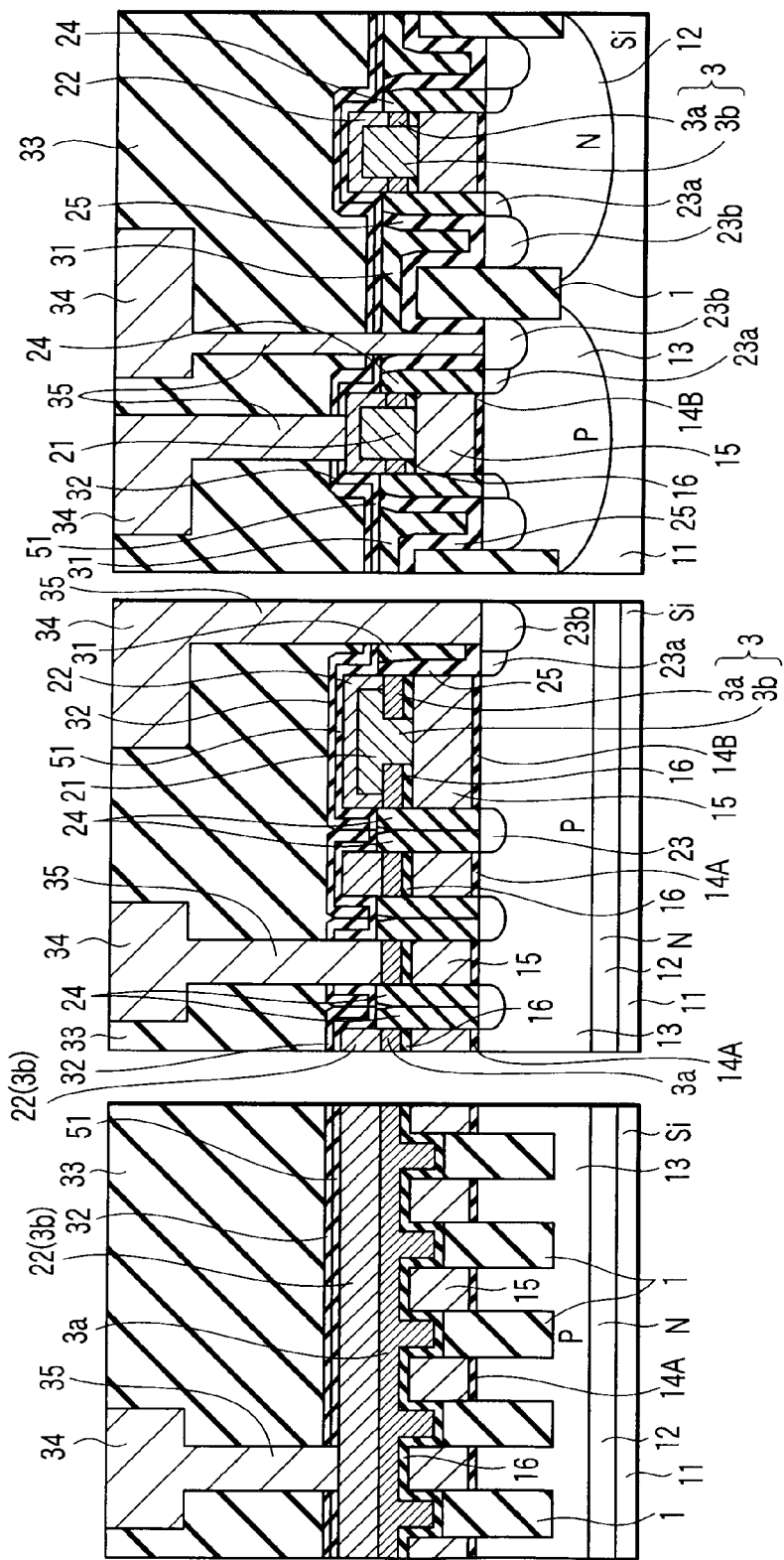
FIGS. 19A to 19C show plan views of a semiconductor storage device according to a modification example of the first embodiment.

Next, a modification example of the first embodiment will be described below with reference to FIGS. 19A, 19B, 19C, 20A, 20B, and 20C. As shown in FIGS. 19A, 19B, and 19C, an oxide film 51 is provided under the covering insulating film 32. That is, the oxide film 51 covers the entire surface of the metallic silicide film 22, and also covers the top surfaces of the sidewall insulating film 24, barrier film 25, and inter-layer insulating film 31. Further, the covering insulating film 32 is provided on the entire surface of the oxide film 51. For example, the oxide film 51 is constituted of a silicon dioxide film, and has a thickness of 50 nm.

A void is generated in the upper surface of the side wall insulating film 24 formed between the memory cell transistors. The void also extends to the middle portion of the side wall insulating film 24. In this case, the void is filled by the covering insulating film (for instance, SiN film) 32, when the covering insulating film 32 is formed on the side wall insulating film 24. Thereby, the memory cell transistors which is located the both sides of the void have a large parasitic capacitance, as the result, the write error and the read error (so-called an inter-cells interference) generated. In the other hand, the upper portion of the void is closed, when the side wall insulating film 24 is covered by the oxide film 51. As the result, the void is not filled by the covering insulating film 32. The inter-cells interference becomes small.

It is preferred that the dielectric constant of the oxide film 51 is lower than that of the covering insulating film 32.

The method of manufacturing the structure shown in FIGS. 19A, 19B, and 19C is as shown below. First, as shown in FIGS. 9A, 9B, and 9C, the void is formed between the memory cell transistors in the process of forming the sidewall insulating film 24, because a space between the memory cell transistors is narrow. After that, shown in FIGS. 11A, 11B, and 11C, the upper surface of the side wall insulating film 24 is lower than that of the void in a process that the upper surface of the side wall insulating film 24 is backed at the upper portion of the boundary area between the first part 3a and the second part 3b of the control gate electrode 3. Thereby, the void which has an opening on the upper surface of the side wall insulating film 24 and extends to the middle portion of the side wall insulating film 24 is formed.

Figures 20A, 20B, 20C:
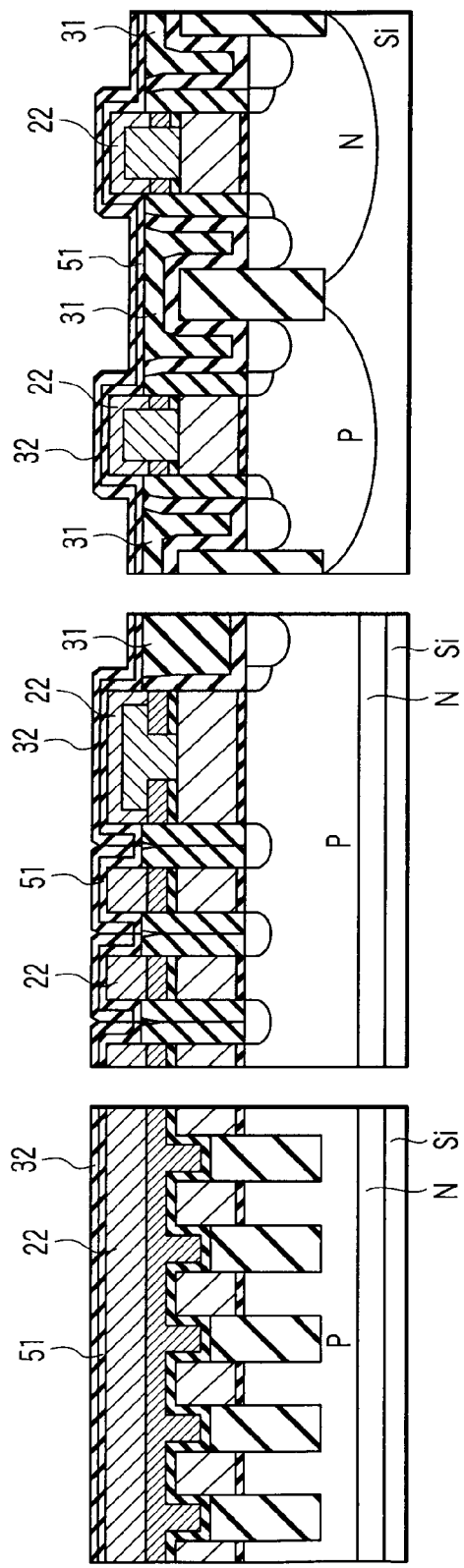
FIGS. 20A to 20C show cross-sectional views showing a part of manufacturing steps of the semiconductor device shown in FIGS. 19A to 19C.

Next, shown in FIGS. 20A, 20B, and 20C, the oxide film 51 is formed by, for instance, CVD or a spattering method, on the structure which is obtained by the process in FIGS. 13A, 13B, and 13C. The oxide film 51 is formed by a depositing condition that the oxide film 51 covers the opening of the void and does not fill the void. If the oxide film 51 is filled in the void, the inter-cells interference is small because the dielectric constant of the oxide film 51 is lower than that of the covering insulating film 32.

Next, the covering insulating film 32 is formed on the entire surface of the oxide film 51 in the same manner as that in the step shown in FIGS. 14A, 14B, and 14C. The covering insulating film 32 does not filled in the void because the oxide film 51 covers the opening of the void.

The step subsequent to the present step is the same as that has been described previously with reference to FIGS. 2A, 2B, and 2C.

According to the semiconductor device associated with the first embodiment of the present invention, a metallic film for forming the metallic silicide film 22 is formed on the sidewall of the control gate electrode 3. Accordingly, metallic atoms for silicidization diffuse not only from the top surface of the control gate electrode 3 but also from the side surfaces thereof. Hence, it is possible to form a thick metallic silicide film 22 over the entire surface of the control gate electrode 3 in the planar direction without depending only on the diffusion of metallic atoms from the top surface.

Since the silicidization of the control gate electrode 3 advances also from the side surfaces thereof, even if the aspect ratio of the control gate electrode 3 becomes high, a metallic silicide film 22 having a desired thickness can be formed.

Further, since the silicidization advances also from the side surfaces of the control gate electrode 3, the distance by which the metallic atoms have to diffuse and which is required to turn the desired thickness into the metallic silicide film 22 is shorter than that in the case where the silicidization advances only from the top surface of the control gate electrode 3. Accordingly, the thickness of the metallic silicide film 22 is prevented from varying from cell transistor to cell transistor, and progress in deterioration by agglomeration can be suppressed.

Second Embodiment

A second embodiment differs from the first embodiment in the step of exposing a second part 3b of a control gate electrode.

A semiconductor device according to the second embodiment of the present invention will be described below with reference to FIGS. 15B to 18A, and 18B. FIG. 15A is a cross-sectional view taken along line IIB-IIB in FIG. 1, and is a cross-sectional view in the same position as FIG. 2B of the first embodiment. FIG. 15B is a cross-sectional view of a peripheral transistor, and is a cross-sectional view in the same position as FIG. 2C of the first embodiment. The cross-sectional view taken along line IIA-IIA in FIG. 1 is the same as that of the first embodiment (FIG. 2A).

As shown in FIGS. 15A and 15B, the entire side surface on the opposite side of the cell transistor of the stacked gate electrode structure of the selection gate transistor is covered with a barrier film 25. The entire side surface of the stacked gate electrode structure of the peripheral transistor is covered with a sidewall insulating film 24. In the peripheral transistor, the entire side surface of the sidewall insulating film 24 is covered with the barrier film 25.

In each of the peripheral transistor region and the region on the opposite side of the cell transistor of the stacked gate electrode structure of the selection gate transistor, the space is filled with an inter-layer insulating film 31 up to the same height as the top surface of a control gate electrode 3, and the top surfaces of the inter-layer insulating film 31 and the barrier film 25 are covered with a covering insulating film 32. The other structures are the same as the first embodiment.

Next, a method of manufacturing the semiconductor device shown in FIGS. 15A and 15B will be described below with reference to FIGS. 16A, 16B to 18A, and 18B.

FIGS. 16A to 18A show a manufacturing method of the structure shown in FIG. 15A in the order of sequence.

FIGS. 16B to 18B show a manufacturing method of the structure shown in FIG. 15B in the order of sequence.

Figure 16A:
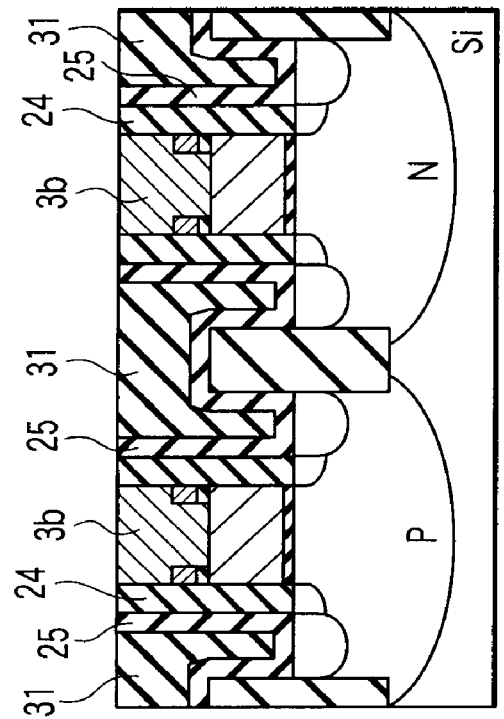
FIGS. 16A and 16B show cross-sectional views showing a art of manufacturing steps of the semiconductor device shown in FIGS. 15A and 15B.
Figure 16B:
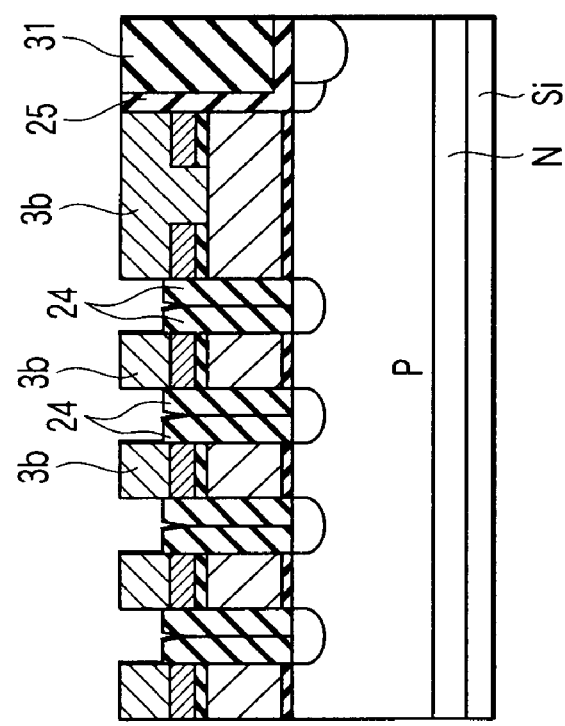

First, the same steps as those shown in FIGS. 3A, 3B, 3C to 10A, 10B, and 10C of the first embodiment are performed. Then, as shown in FIGS. 16A and 16B, the top surface of the inter-layer insulating film 31 is caused to retreat until a mask material 42 is exposed as in the step shown in FIGS. 11B and 11C. Thereafter, the mask material 42 on the top surface of a second part 3b of the control gate electrode 3 is removed.

Then, a mask material (not shown) having an opening above the cell transistor is formed on the control gate electrode 3. Then, the top surface of the sidewall insulating film 24 of the cell transistor is caused to retreat in accordance with the condition described in the first embodiment by etching using the mask material as a mask. At this time, the top surface of the sidewall insulating film 24 of the selection gate transistor may be or may not be caused to retreat likewise. Then, the mask material is removed.

Figure 17A:
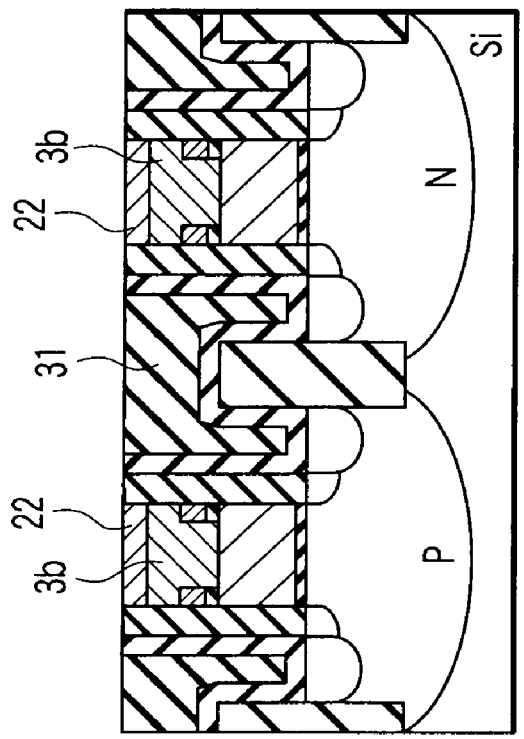
FIGS. 17A and 17B show cross-sectional views showing steps subsequent to those shown in FIGS. 16A and 16B.
Figure 17B:
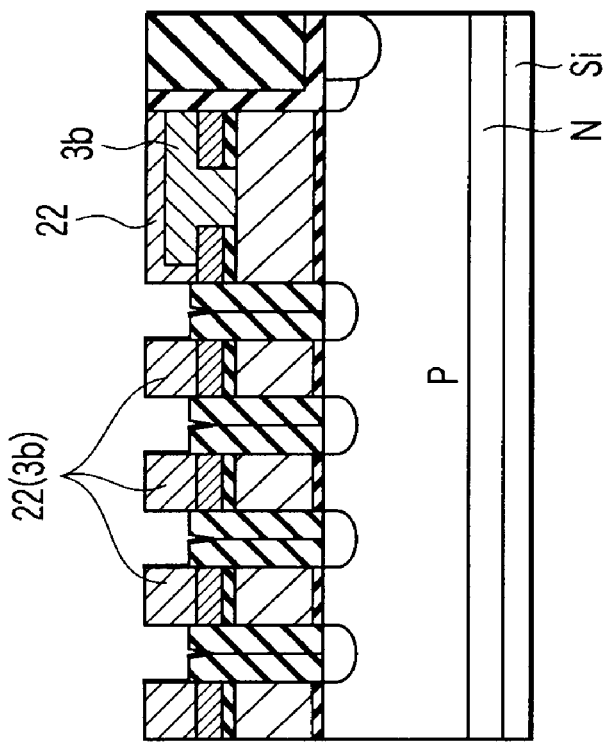

Then, as shown in FIGS. 17A and 17B, a metallic film 43 is formed on the entire surface of the structure obtained by the steps performed up to now as in the step shown in FIGS. 12B and 12C. At this time, unlike in the first embodiment, the metallic film 43 is formed only, of parts of the second part of the control gate electrode 3 of each transistor, on the side surface of the cell transistor and the side surface on the cell transistor side of the selection gate transistor. In the peripheral transistor, the metallic film 43 is formed only on the top surface of the control gate electrode 3.

Subsequently, as in the step shown in FIGS. 13B and 13C, a part of the second part 3b of the control gate electrode 3 in contact with the metallic film 43 is silicidized. As a result of this, in the cell transistor, of parts of the second part 3b of the control gate electrode 3, a region defined by the same thickness as the thickness extending over the entirety in the planar direction and exposed is silicidized. As for the second part 3b of the control gate electrode 3 of the selection gate transistor, only a part near the surface of the side surface on the cell transistor side and the top surface are silicidized. In the peripheral transistor, only a part near the surface of the top surface of the second part 3 of the control gate electrode 3 is silicidized.

Figure 18B:
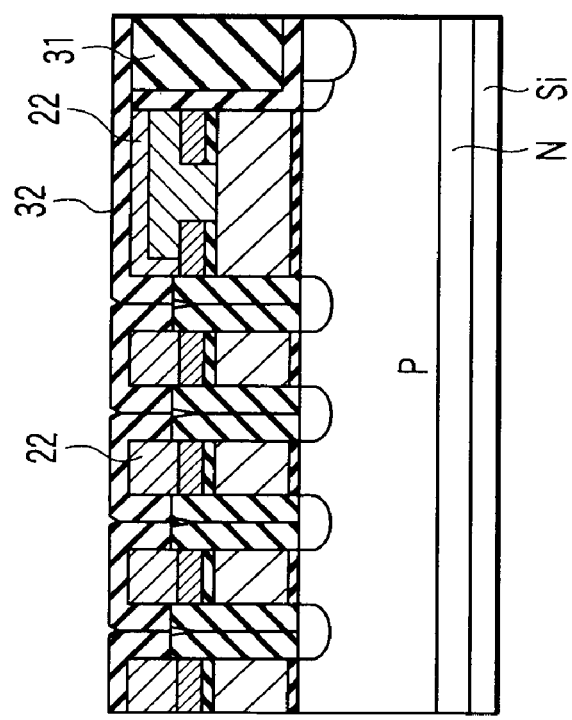
FIGS. 18A and 18B show cross-sectional views showing steps subsequent to those shown in FIGS. 17A and 17B.
Figure 18A:
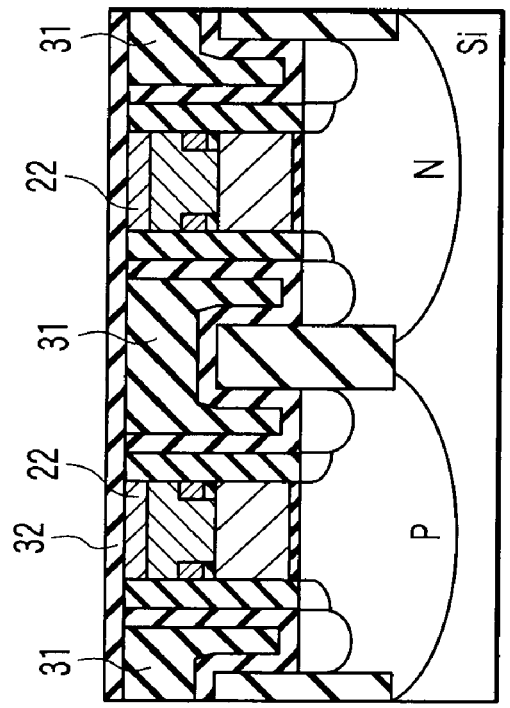

Then, as shown in FIGS. 18A and 18B, a covering insulating film 32 is formed on the entire surface of the structure obtained by the steps performed up to now as in the step shown in FIGS. 14B and 14C. Then, as shown in FIGS. 15A and 15B, an inter-layer insulating film 33, wiring layer 34, plug 35, and the like are formed.

According to the semiconductor device associated with the second embodiment of the present invention, as in the first embodiment, a metallic film for forming a metallic silicide film 22 is formed on the sidewall of the control gate electrode 3. Accordingly, the same effect as that of the first embodiment can be obtained.

Furthermore, the present invention is not limited to the first and second embodiments described above in the idea and the category of the present invention, and their alteration examples and modification examples are also included in the scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a first insulating film provided on a semiconductor substrate in a cell transistor region;
a charge storage film provided on the first insulating film;
a second insulating film provided on the charge storage film;
a control gate electrode including a first conductive film and a second conductive film on the first conductive film, the first conductive film provided on the second insulating film, the second conductive film comprising a first metallic silicide film;
first source/drain regions formed on a surface of the semiconductor substrate and sandwiching a region under the first insulating film;
a third insulating film provided on the semiconductor substrate in a peripheral transistor region;
a gate electrode including a third conductive film and a fourth conductive film on the third conductive film, the third conductive film provided on the third insulating film, the fourth conductive film comprising a polysilicon film and a second metallic silicide film on a top surface of the polysilicon film, the second metallic silicide film extending entirely over the top surface and side surfaces of the polysilicon film in the fourth conductive film;
second source/drain regions formed on the surface of the semiconductor substrate and sandwiching a region under the third insulating film;
a side wall insulating film formed on a side surface of the control gate electrode and the charge storage film; and
a barrier film formed on the semiconductor substrate and at least one of the side wall insulating film and a side surface of the gate electrode,
wherein the first and third conductive films are comprised of the same material, the first and second metallic silicide films are comprised of the same material, and a highest point of the side wall insulating film and the barrier film is higher than a top surface of the second insulating film and lower than a top surface of the second conductive film.

2. The device according to claim 1, wherein
a thickness in a vertical direction of the second metallic silicide film on the side surface of the polysilicon film is equal to that of the first metallic silicide film.

3. The device according to claim 2, wherein
the gate electrode further includes a fourth insulating film formed between the third conductive film and the fourth conductive film, the fourth insulating film has an opening, and the fourth conductive film is formed in the opening.

4. The device according to claim 1, wherein
the control gate electrode includes a first part covering a top surface of the second insulating film, and a second part covering a top surface of the first part, and
the first metallic silicide film occupies an entire part of the second part of the control gate electrode.

5. The device according to claim 1, wherein
a width of the fourth conductive film is larger than that of the second conductive film.

6. The device according to claim 1, further comprising
stacked gate electrode structures, each having the first conductive film, the second insulating film, and the second conductive film including the first metallic silicide film.

7. The device according to claim 6, wherein
the side wall insulating film is also formed between the stacked gate electrode structures and formed on a side surface of the third conductive film, and an upper surface of the side wall insulating film which is formed between the stacked gate electrode structures is equal to that of the side wall insulating film which is formed on the side surface of the third conductive film.

8. The device according to claim 1, wherein
an under surface of the side wall insulating film is lower than that of the first conductive film.

9. The device according to claim 1, further comprising
a void which has an opening located at the upper surface of the side wall insulating film, and which extends to a middle of the side wall insulating film; and
a silicon oxide film which covers the upper and side surfaces of the second conductive film, and which covers the side wall insulating film.

10. The device according to claim 9, wherein
the silicon oxide film is formed in the void.

11. The device according to claim 1, wherein
the first metallic silicide film is formed on a side surface of the second conductive film that is facing the side wall insulating film.

12. The device according to claim 1, wherein
the second metallic silicide film has an upside-down concave shape.

13. A semiconductor device comprising:
a first insulating film provided on a semiconductor substrate in a peripheral transistor region;
a first conductive film provided on the first insulating film;
a first inter-electrode insulating film provided on the first conductive film;
a second conductive film provided on the first inter-electrode insulating film and having a first metallic silicide film on a top surface and side surfaces thereof, a thickness in a vertical direction of the first metallic silicide film on each side surface of the second conductive film being thicker than that of the first metallic silicide film at the center of the second conductive film, the first metallic silicide film extending entirely over the top surface and side surfaces of the second conductive film;
first source/drain regions formed on the surface of the semiconductor substrate and sandwiching a region under the first insulating film;
a side wall insulating film formed on a side surface of the first and second conductive films; and
a barrier film formed on the semiconductor substrate and at least one of the side wall insulating film and a side surface of the first and second conductive films,
wherein a highest point of the side wall insulating film is higher than a top surface of the first inter-electrode insulating film and lower than a top surface of the second conductive film.

14. The device according to claim 13, further comprising:
a second insulating film provided on the semiconductor substrate;
a third conductive film provided on the second insulating film;
a second inter-electrode insulating film provided on the third conductive film; and
a fourth conductive film which is provided on the second inter-electrode insulating film and in which an entire part extending in a vertical direction from a top surface by a first thickness is constituted of a second metallic silicide film.

15. The device according to claim 14, wherein
a thickness in the vertical direction of the first metallic silicide film on each side surface of the second conductive film is equal to the first thickness.

16. The device according to claim 14, wherein
a width of the fourth conductive film is narrower than that of the second conductive film.

17. The device according to claim 13, wherein
the first metallic silicide film is formed on a side surface of the second conductive film that is facing the side wall insulating film.

18. The device according to claim 13, wherein
the first metallic silicide film has an upside-down concave shape.

* * * * *